US011469106B2

United States Patent
Toshima et al.

(10) Patent No.: US 11,469,106 B2
(45) Date of Patent: Oct. 11, 2022

(54) HARD MASK AND HARD MASK FORMING METHOD

(71) Applicant: Tokyo Electron Limited, Tokyo (JP)

(72) Inventors: Hiroyuki Toshima, Yamanashi (JP); Shinji Furukawa, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 53 days.

(21) Appl. No.: 16/347,182

(22) PCT Filed: Nov. 1, 2017

(86) PCT No.: PCT/JP2017/039569
§ 371 (c)(1),
(2) Date: May 2, 2019

(87) PCT Pub. No.: WO2018/084186
PCT Pub. Date: May 11, 2018

(65) Prior Publication Data
US 2020/0266063 A1    Aug. 20, 2020

(30) Foreign Application Priority Data

Nov. 7, 2016  (JP) .............................. JP2016-217037

(51) Int. Cl.
*G03F 7/20* (2006.01)
*G03F 1/26* (2012.01)
*H01L 21/033* (2006.01)

(52) U.S. Cl.
CPC ...... *H01L 21/0332* (2013.01); *H01L 21/0335* (2013.01); *H01L 21/0337* (2013.01)

(58) Field of Classification Search
CPC .......... H01L 21/02642; H01L 21/2855; C23C 14/34; C23C 14/0682
See application file for complete search history.

(56) References Cited

U.S. PATENT DOCUMENTS 5,013,682 A * 5/1991 Plumton ................. H01L 21/28
117/106
5,229,323 A * 7/1993 Shimada ............. H01L 21/2633
148/DIG. 139

(Continued)

FOREIGN PATENT DOCUMENTS

JP    H11-209872 A    8/1999
JP    2003-243526 A   8/2003

(Continued)

OTHER PUBLICATIONS

PCT International Search Report, PCT/JP2017/039569, dated May 11, 2018, 4 Pages.

*Primary Examiner* — Bradley Smith
*Assistant Examiner* — David J Goodwin
(74) *Attorney, Agent, or Firm* — Fenwick & West LLP

(57) ABSTRACT

In one embodiment, this hard mask for plasma etching is formed on a silicon-containing film. The hard mask is an amorphous film, and contains tungsten and silicon. The ratio of the concentration of tungsten and the concentration of silicon in the surface of the hard mask can be within the range between a ratio specifying that the concentration of tungsten is 35 at % and the concentration of silicon is 65 at % and a ratio specifying that the concentration of tungsten is 50 at % and the concentration of silicon is 50 at %.

6 Claims, 5 Drawing Sheets

(56) References Cited

U.S. PATENT DOCUMENTS

| | | | |
|---|---|---|---|
| 5,700,734 A * | 12/1997 | Ooishi | H01L 29/6659 |
| | | | 257/E21.2 |
| 6,331,478 B1 * | 12/2001 | Lee | H01L 21/32134 |
| | | | 438/592 |
| 6,759,683 B1 * | 7/2004 | Cole | H01L 21/0485 |
| | | | 257/757 |
| 2003/0161081 A1 | 8/2003 | Girardie | |
| 2005/0067371 A1 | 3/2005 | Okawa et al. | |
| 2005/0106837 A1 | 5/2005 | Nakai et al. | |
| 2006/0024945 A1 | 2/2006 | Kim | |
| 2007/0224764 A1 | 9/2007 | Takami | |
| 2010/0285409 A1 * | 11/2010 | Tanaka | H01L 21/32139 |
| | | | 430/315 |
| 2011/0049629 A1 | 3/2011 | Ishikawa et al. | |
| 2014/0363942 A1 * | 12/2014 | Hong | H01L 21/324 |
| | | | 438/287 |
| 2015/0338731 A1 * | 11/2015 | Nozawa | G03F 1/26 |
| | | | 430/5 |
| 2017/0287727 A1 | 10/2017 | Kikuchi et al. | |

FOREIGN PATENT DOCUMENTS

| | | |
|---|---|---|
| JP | 2005-099605 A | 4/2005 |
| JP | 2005-150403 | 6/2005 |
| JP | 2006-041486 A | 2/2006 |
| JP | 2007-294836 A | 11/2007 |
| JP | 2011-054718 A | 3/2011 |
| JP | 2016-066717 A | 4/2016 |
| KR | 10-2006-0010932 A | 2/2006 |

* cited by examiner

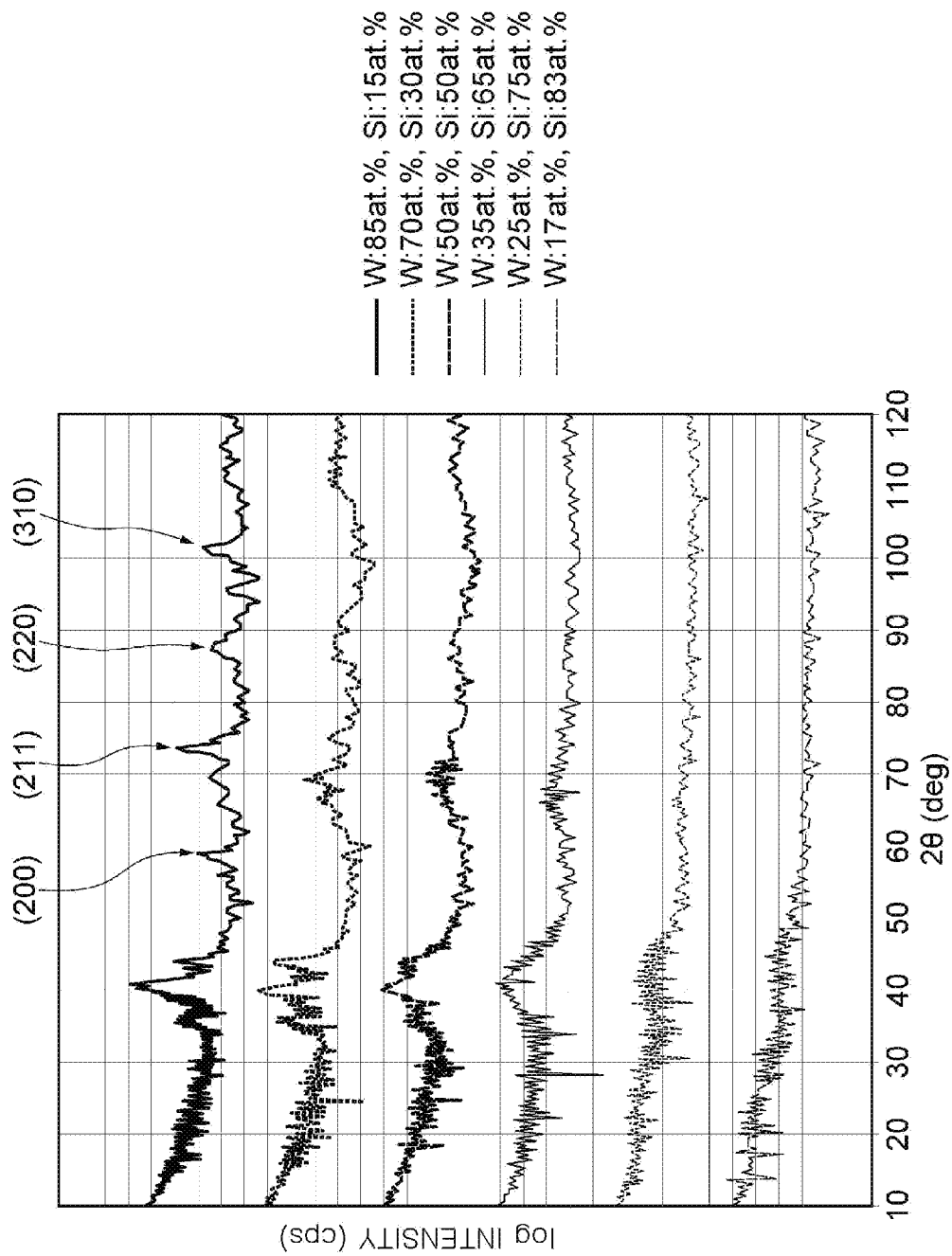

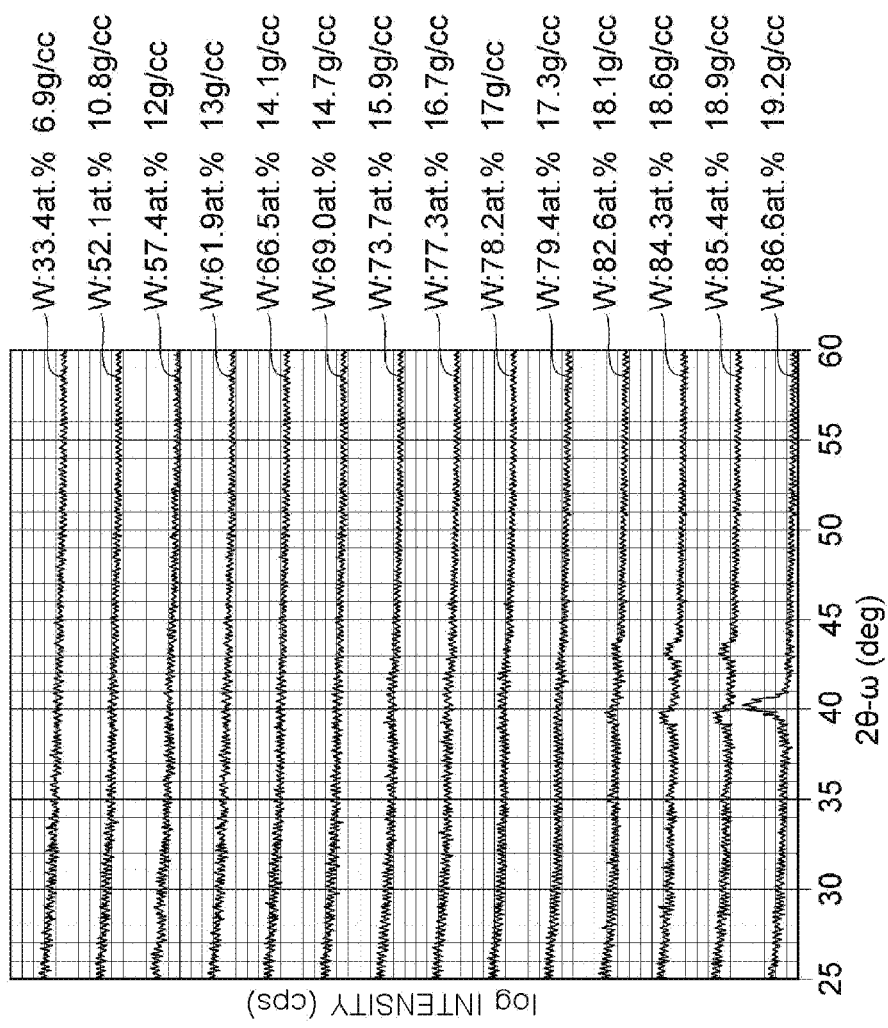

HARD MASK AND HARD MASK FORMING METHOD

TECHNICAL FIELD

The present disclosure relates to a hard mask and a hard mask forming method.

BACKGROUND

In manufacturing electronic devices such as semiconductor devices and the like, plasma etching may be performed on a silicon-containing film to form an opening such as a hole or a trench in the silicon-containing film. In order to form the opening, a mask is provided on the silicon-containing film. As for a mask, a resist mask is known.

Recently, elements in an electronic device have three-dimensional structures and, thus, a deep opening is formed in the silicon-containing film. However, the resist mask is considerably consumed during the plasma etching of the silicon-containing film. Therefore, a hard mask is used. As for the hard mask, a hard mask made of tungsten silicide or titanium nitride (TiN) is used as disclosed in Japanese Patent Application Publication Nos. 2007-294836, 2003-243526, and 2005-150403.

The elements in the electronic devices have electrodes made of tungsten and silicon-containing films. Therefore, tungsten silicide is preferably used as a material forming a hard mask for plasma etching. However, the hard mask made of tungsten silicide is partially etched quickly. If the thickness of the hard mask is increased to maintain the hard mask until the end of plasma etching, a target object warps due to the film stress of the hard mask. Accordingly, a hard mask that is highly resistant to plasma etching is required.

SUMMARY

In accordance with an aspect of the present disclosure, there is provided a hard mask for plasma etching formed on a silicon-containing film. The hard mask is an amorphous film containing tungsten and silicon. Generally, a tungsten silicide film is formed by a chemical vapor deposition (CVD) method and contains tungsten silicide ($WSi_2$). Such a tungsten silicide film contains metal crystals. Therefore, the tungsten silicide film has a low resistance to plasma etching at crystal grain boundaries and is etched quickly at the crystal grain boundaries. The hard mask is an amorphous film and thus has substantially no crystal grain boundary. Therefore, the hard mask is highly resistant to plasma etching.

In one embodiment, a ratio of a concentration of tungsten and a concentration of silicon on a surface of the hard mask is within a range between a ratio specifying that the concentration of tungsten is 35 at. % and the concentration of silicon is 65 at. % and a ratio specifying that the concentration of tungsten is 50 at. % and the concentration of silicon is 50 at. %.

In one embodiment, a ratio of a concentration of tungsten and a concentration of silicon inside the hard mask with respect to a surface of the hard mask is within a range between a ratio specifying that the concentration of tungsten is 59 at. % and the concentration of silicon is 41 at. % and a ratio specifying that the concentration of tungsten is 70.5 at. % and the concentration of silicon is 29.5 at. %.

In one embodiment, a ratio of a concentration of tungsten and a concentration of silicon inside the hard mask with respect to a surface of the hard mask is within a range between a ratio specifying that the concentration of tungsten s 50 at. % and the concentration of silicon is 50 at. % and a ratio specifying that the concentration of tungsten is 79.4 at. % and the concentration of silicon is 20.6 at. %.

In one embodiment, a film density of the hard mask is greater than or equal to 10.428 g/cc and smaller than or equal to 17.3 g/cc.

In accordance with another aspect of the present disclosure, there is provided a hard mask forming method. The hard mask forming method includes: preparing a target object having a silicon-containing film in a chamber body of a film forming apparatus; and forming a hard mask containing tungsten and silicon, which is an amorphous film, on the silicon-containing film by sputtering using the film forming apparatus.

In one embodiment, the hard mask is formed using a target containing tungsten and silicon in the film forming apparatus.

In one embodiment, a ratio of a concentration of tungsten and a concentration of silicon in the target is within a range between a ratio specifying that the concentration of tungsten is 59 at. % and the concentration of silicon is 41 at. % and a ratio specifying that the concentration of tungsten is 70.5 at. % and the concentration of silicon is 29.5 at. %.

In one embodiment, a ratio of a concentration of tungsten and a concentration of silicon in the target is within a range between a ratio specifying that the concentration of tungsten is 50 at. % and the concentration of silicon is 50 at. % and a ratio specifying that the concentration of tungsten is 79.4 at. % and the concentration of silicon is 20.6 at. %.

In one embodiment, the hard mask is formed using a first target made of tungsten and a second target made of silicon by the film forming apparatus.

In one embodiment, a voltage to be applied to the first target and a voltage to be applied to the second target are adjusted such that a ratio of a concentration of tungsten and a concentration of silicon on a surface of the hard mask is within a range between a ratio specifying that the concentration of tungsten is 35 at. % and the concentration of silicon is 65 at. % and a ratio specifying that the concentration of tungsten is 50 at. % and the concentration of silicon is 50 at. %.

In one embodiment, a voltage to be applied to the first target and a voltage to be applied to the second target are adjusted such that a ratio of a concentration of tungsten and a concentration of silicon inside the hard mask with respect to a surface of the hard mask is within a range between a ratio specifying that the concentration of tungsten is 59 at. % and the concentration of silicon is 41 at. % and a ratio specifying that the concentration of tungsten is 70.5 at. % and the concentration of silicon is 29.5 at. %.

In one embodiment, a voltage to be applied to the first target and a voltage to be applied to the second target are adjusted such that a ratio of a concentration of tungsten and a concentration of silicon inside the hard mask with respect to a surface of the hard mask is within a range between a ratio specifying that the concentration of tungsten is 50 at. % and the concentration of silicon is 50 at. % and a ratio specifying that the concentration of tungsten is 79.4 at. % and the concentration of silicon is 20.6 at. %.

BRIEF DESCRIPTION OF THE DRAWINGS

FIG. 4 shows an X-ray diffraction analysis result of hard masks having different ratios of a concentration of tungsten and a concentration of silicon.

FIG. 5 shows another X-ray diffraction analysis result of hard masks having different ratios of a concentration of tungsten and a concentration of silicon.

DETAILED DESCRIPTION

Figure 1:
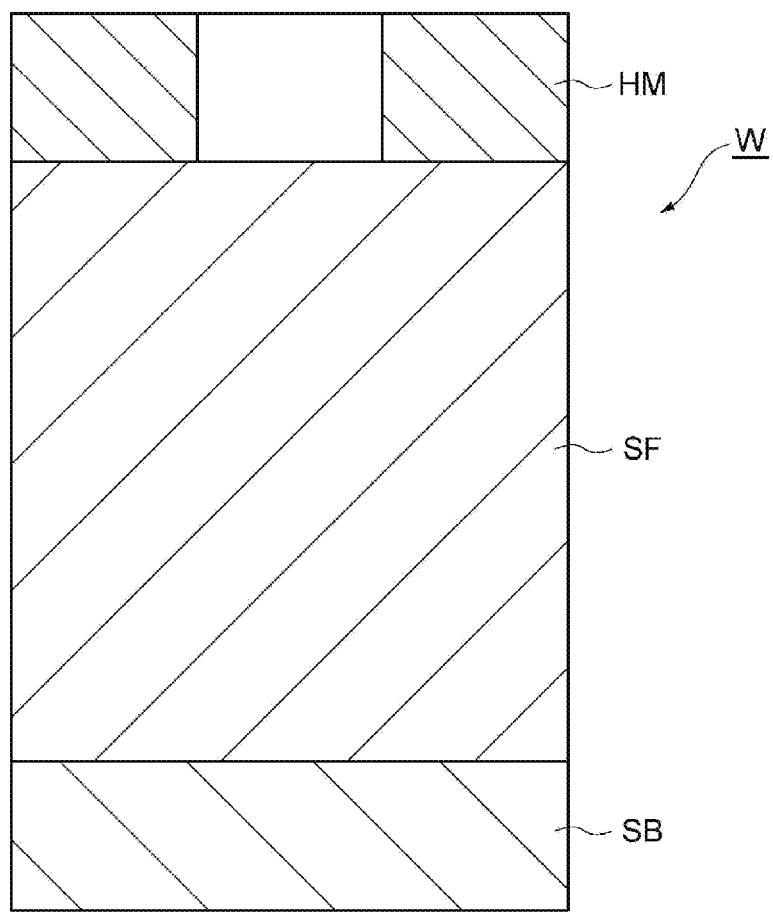
FIG. 1 is a cross-sectional view showing a silicon-containing film and a part of a hard mask according to one embodiment.

Hereinafter, embodiments will be described in detail with reference to the accompanying drawings. Like reference numerals will be given to like or corresponding parts throughout the drawings.

FIG. 1 is a cross-sectional view of a silicon-containing film and a part of a hard mask according to one embodiment. A target object W shown in FIG. 1 includes a substrate SB and a silicon-containing film SF. The silicon-containing film SF is provided on the substrate SB. The silicon-containing film SF may be a monolayer film made of any material containing silicon, such as single crystalline silicon, polycrystalline silicon, silicon oxide, or silicon nitride. Alternatively, the silicon-containing film SF may be a multilayer film made of two or more materials selected among single crystalline silicon, polycrystalline silicon, silicon oxide, and silicon nitride.

The hard mask HM is a hard mask for plasma etching of the silicon-containing film SF. The hard mask HM is formed on the silicon-containing film SF. A pattern to be transferred to the silicon-containing film SF is formed in the hard mask HM. The pattern may be a hole or a groove. The hard mask HM contains tungsten (W) and silicon (Si). The hard mask HM is an amorphous film made of tungsten (W) and silicon (Si).

Generally, a tungsten silicide film is formed by a chemical vapor deposition (CVD) method and contains tungsten silicide ($WSi_2$). Such a tungsten silicide film contains metal crystals. Therefore, the tungsten silicide film has a low resistance to plasma etching at crystal grain boundaries and is etched quickly at the crystal grain boundaries. The hard mask HM is an amorphous film and thus has substantially no crystal grain boundary. Therefore, the hard mask HM is highly resistant to plasma etching.

In one embodiment, the ratio of the concentration of tungsten to the concentration of silicon on the surface of the hard mask HM is within a range between a ratio specifying that the concentration of tungsten is 35 at. % and the concentration of silicon is 65 at. % and a ratio specifying the concentration of tungsten is 50 at. % and the concentration of silicon is 50 at. %. If the concentration of tungsten on the surface of the hard mask HM is 50 at. % or less, tungsten crystals hardly exist in the hard mask HM. Therefore, a hard mask HM having a higher resistance to plasma etching is provided. Further, the hard mask HM is a mask for etching the silicon-containing film SF, and thus needs to be resistant to etching of silicon. If the concentration of silicon on the surface of the hard mask HM is 65 at. % or less, the hard mask HM has a higher resistance to the etching of the silicon-containing film SF. The concentration of tungsten and the concentration of silicon on the surface of the hard mask HM can be measured by X-ray photoelectron spectroscopy after the surface is oxidized in an atmospheric environment.

Since the inside of a hard mask HM is not oxidized compared to the surface of the hard mask HM, the concentration of tungsten inside the hard mask HM is different from the concentration of tungsten on the surface of the hard mask HM. Further, the concentration of silicon in the hard mask HM is different from the concentration of silicon on the surface of the hard mask HM. However, the concentration on the surface of the hard mask HM can be converted into the concentration in the hard mask HM. The concentration can be converted using a function. This function can be obtained by a test and can represent the corresponding relationship between the concentrations on the surfaces of the hard masks HM of a plurality of samples and the concentrations in the hard masks HM of the samples. In the case of using the function to convert the concentrations specifying the upper limit and the lower limit of the ratio of the concentration of tungsten and the concentration of silicon on the surface of the hard mask HM, the ratio of the concentration of tungsten and the concentration of silicon in the hard mask HM is within a range between a ratio specifying the concentration of tungsten is 59 at. % and the concentration of silicon is 41 at. % and a ratio specifying the concentration of tungsten is 70.5 at. % and the concentration of silicon is 29.5 at. %.

In another embodiment, the ratio of the concentration of tungsten and the concentration of silicon inside the hard mask HM with respect to the surface of the hard mask HM is within a range between a ratio specifying that the concentration of tungsten is 50 at. % and the concentration of silicon is 50 at. % and a ratio specifying the concentration of tungsten is 79.4 at. % and the concentration of silicon is 20.6 at. %. The concentration of tungsten and the concentration of silicon in the hard mask HM are measured by X-ray photoelectron spectroscopy after the hard mask HM is etched by sputtering. During the etching using sputtering and the measurement using X-ray photoelectron spectroscopy, the hard mask HM is maintained in a vacuum environment without being exposed to the atmosphere.

If the concentration of tungsten is 79.4 at. % or less in the hard mask HM formed by sputtering, the hard mask HM becomes an amorphous film. In order to selectively remove the hard mask HM with respect to the silicon-containing film SF by wet etching after plasma etching of the silicon-containing film SF, the concentration of tungsten in the hard mask HM should be 50 at. % or more. Therefore, the hard mask HM of the present embodiment has a high resistance to plasma etching and can be selectively removed with respect to the silicon-containing film SF by wet etching after the etching of the silicon-containing film SF. The above-described range of the ratio of the concentration of tungsten and the concentration of silicon in the hard mask HM can be converted to a range of the film density of the hard mask HM that is greater than or equal to 10.428 g/cc and smaller than or equal to 17.3 g/cc. The film density of the hard mask HM can be obtained by an X-ray reflectivity measurement method.

Figure 2:
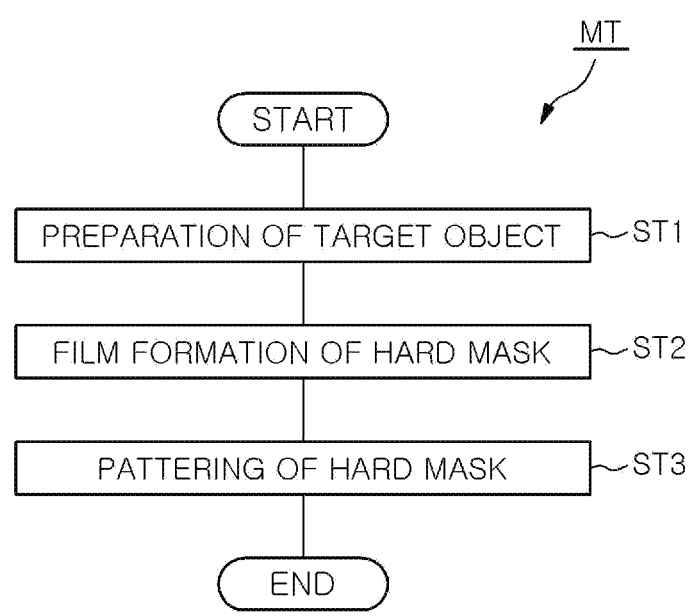
FIG. 2 is a flowchart of a hard mask forming method according to one embodiment.

Hereinafter, the hard mask forming method according to one embodiment will be described. FIG. 2 is a flowchart of the hard mask forming method according to one embodiment. In a method MT shown in FIG. 2, first, a step ST1 is executed. In the step ST1, the target object W having the silicon-containing film SF is prepared in a chamber body of the film forming apparatus.

Figure 3:
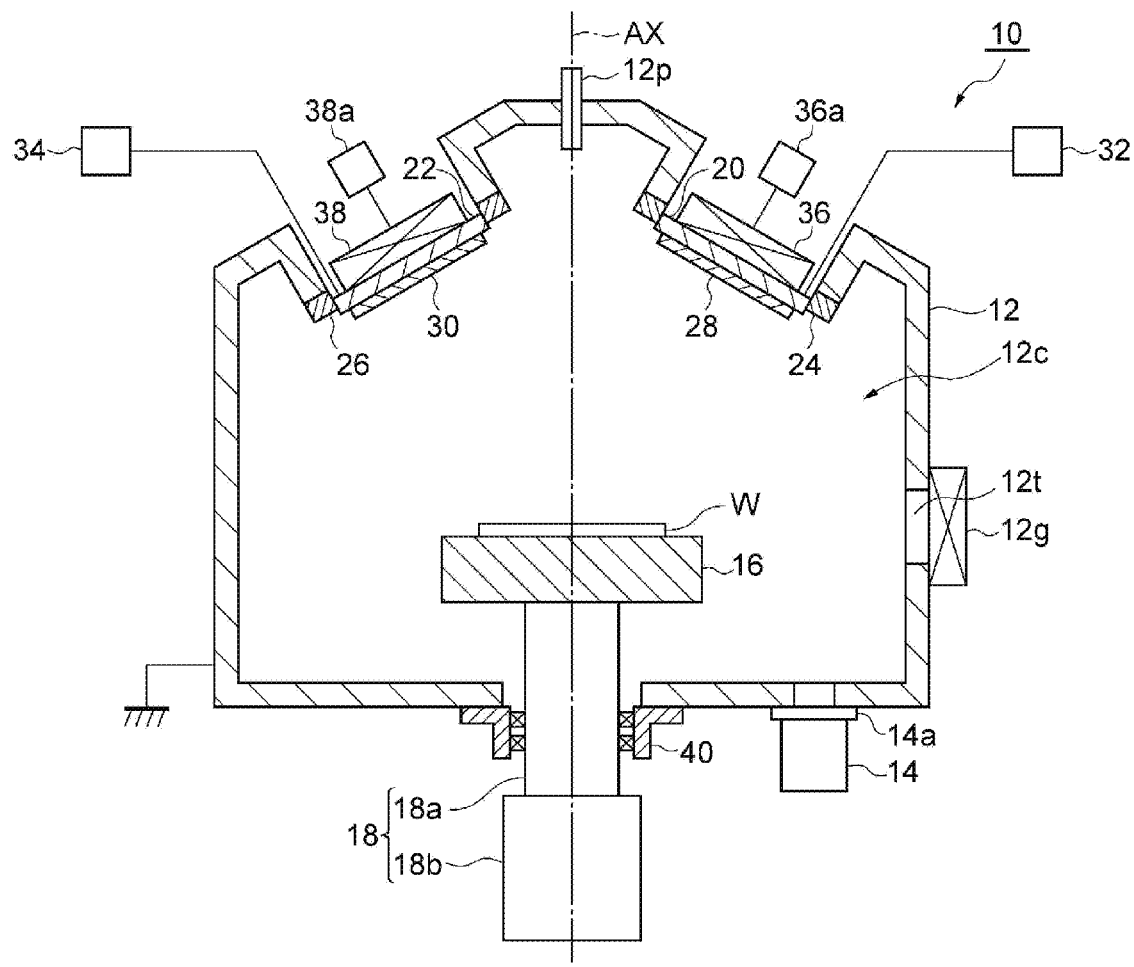
FIG. 3 shows an example of a film forming apparatus that can be used for the method shown in FIG. 2.

FIG. 3 shows an example of a film forming apparatus that can be used for the method shown in FIG. 2. A film forming apparatus 10 shown in FIG. 3 forms a film by sputtering. The film forming apparatus 10 includes a chamber body 12. The chamber body 12 has a substantially cylindrical shape. The chamber body 12 has an inner space serving as a chamber 12c. The chamber body 12 is made of a conductor, e.g., aluminum. The chamber body 12 is connected to a ground potential.

A gas exhaust unit 14 for reducing a pressure in the chamber 12c is connected to a bottom portion of the chamber body 12 via an adapter 14a. The gas exhaust unit 14 includes a pressure controller and a vacuum pump such as a dry pump and/or a turbo molecular pump. An opening 12t through which the target object W is loaded into and unloaded from the chamber 12c is formed on a sidewall of the chamber body 12. The opening 12t can be opened and closed by a gate valve 12g.

The chamber body 12 is provided with a port 12p. The port 12p provides a flow path for introducing gas into the chamber body 12. A gas supply unit is connected to the port 12p to supply gas into the chamber 12c through the port 12p. The gas supplied into the chamber 12c may be an inert gas such as a rare gas or a nitrogen gas.

A stage 16 is provided in the chamber 12c. The stage 16 is configured to support the target object W mounted thereon. The stage 16 may have an electrostatic chuck for holding the target object W. Further, the stage 16 may have a temperature control unit such as a heater.

The stage 16 is connected to a driving unit 18. The driving unit 18 includes a supporting shaft 18a and a driving device 18b. The supporting shaft 18a extends from a position directly below the stage 16 to the outside of the chamber body 12 through the bottom portion of the chamber body 12. The central axis of the supporting shaft 18a coincides with an axis AX extending in the vertical direction. A sealing member 40 is provided between the supporting shaft 18a and the bottom portion of the chamber body 12. The sealing member 40 seals the space between the bottom of the chamber body 12 and the supporting shaft 18a so that the supporting shaft 18a can rotate and move vertically. The sealing member 40 may be, e.g., a magnetic fluid seal.

The stage 16 is connected to one end of the supporting shaft 18a, and the driving device 18b is connected to the other end of the supporting shaft 18a. The driving device 18b generates a driving force for rotating and vertically moving the supporting shaft 18a. The stage 16 rotates about the axis AX by the rotation of the supporting shaft 18a, and vertically moves by the vertical movement of the supporting shaft 18a.

Holders 20 and 22 are attached to a ceiling portion of the chamber body 12. The holders 20 and 22 are made of a metal. The holder 20 is supported at the ceiling portion of the chamber body 12 via an insulating member 24. The holder 22 is supported at the ceiling portion of the chamber body via an insulating member 26. The holder 20 holds a target 28 (first target), and the holder 22 holds a target 30 (second target).

The holders 20 and 22 respectively hold the targets 28 and 30 such that the targets 28 and 30 are arranged substantially symmetrically with respect to a virtual plane including the axis AX. Further, the holders 20 and 22 respectively hold the targets 28 and 30 such that the target 28 and the target 30 are inclined to be closer to the axis AX as going upward.

A power supply 32 is electrically connected to the holder 20. The power supply 32 generates a voltage to be applied to the holder 20. The voltage from the power supply 32 is applied to the target 28 via the holder 20. The power supply 32 may be a DC power supply or a high frequency power supply. When the power supply 32 is a high frequency power supply, the power supply 32 is connected to the holder 20 via a matching device for making an impedance of a load side close or equal to a matching point.

A power supply 34 is electrically connected to the holder 22. The power supply 34 generates a voltage to be applied to the holder 22. The voltage from the power supply 34 is applied to the target 30 via the holder 22. The power supply 34 may be a DC power supply or a high frequency power supply. When the power supply 34 is a high frequency power supply, the power supply 34 is connected to the holder 22 via a matching device for making the impedance of the load side close or equal to the matching point.

The film forming apparatus 10 may further include cathode magnets 36 and 38. The cathode magnet 36 is provided outside the chamber body 12 to face the target 28 via the holder 20. The cathode magnet 38 is provided outside the chamber body 12 to face the target 30 via the holder 22. The cathode magnets 36 and 38 are connected to magnet driving units 36a and 38a, respectively.

In the case of forming a film by the film forming apparatus 10, the target object W is loaded into the chamber body 12, mounted on the stage 16, and supported by the stage 16. Then, the vertical position of the stage 16 is adjusted by the driving unit 18, and the stage 16 is rotated about the axis line AX. The rotation of the stage 16 is continued during the film formation. Next, a gas is supplied from the gas supply unit to the chamber 12c, and the pressure in the chamber 12c is decreased by the gas exhaust unit 14. Voltages are applied to the targets 28 and 30 by the power supplies 32 and 34. The cathode magnets 36 and 38 are driven by the magnet driving units 36a and 38a, respectively. Accordingly, plasma is concentrated near the targets 28 and 30. Then, positive ions in the plasma collide with the targets 28 and 30, so that materials forming the targets 28 and 30 are released therefrom. The released materials are deposited on the target object W. As a result, a film is formed on the target object W.

In one embodiment, the targets 28 and 30 contain tungsten and silicon, respectively. In the targets 28 and 30 of the present embodiment, the concentration of tungsten and the concentration of silicon are adjusted such that an amorphous film containing tungsten and silicon is formed on the target object W. In one embodiment, the ratio of the concentration of tungsten and the concentration of silicon in the targets 28 and 30 is within a range between a ratio specifying that the concentration of tungsten is 59 at. % and the concentration of silicon is 41 at. %, and a ratio specifying that the concentration of tungsten is 70.5 at. % and the concentration of silicon is 29.5 at. %. In another embodiment, the ratio of the concentration of tungsten and the concentration of silicon in the targets 28 and 30 is within a range between a ratio specifying that the concentration of tungsten is 50 at. % and the concentration of silicon is 50 at. % and a ratio specifying the concentration of tungsten is 79.4 at. % and the concentration of silicon is 20.5 at. %.

In the case where the target used in the film forming apparatus 10 contains tungsten and silicon, at least one of the targets 28 and 30 can be used for the film formation. When only one of the targets 28 and 30 is used for the film formation, a voltage is applied only to the holder that supports the used target. Only the cathode magnet corresponding to the used target is driven by the corresponding magnet driving unit.

In another embodiment, the target 28 is made of tungsten and the target 30 is made of silicon. In this embodiment, both of the targets 28 and 30 are used for the film formation. The voltages applied to the targets 28 and 30 are adjusted such that an amorphous film containing tungsten and silicon is formed on the target object W.

Specifically, the voltages applied to the targets 28 and 30 are adjusted such that the ratio of the concentration of tungsten and the concentration of silicon on the surface of the hard mask HM is within a range between a ratio specifying that the concentration of tungsten is 35 at. % and the concentration of silicon is 65 at. % and a ratio specifying that the concentration of tungsten is 50 at. % and the concentration of silicon is 50 at. %. In other words, the voltages applied to the targets 28 and 30 are adjusted such that the ratio of the concentration of tungsten and the concentration of silicon in the hard mask HM is within a range between a ratio specifying that the concentration of tungsten is 59 at. % and the concentration of silicon is 41 at. % and a ratio specifying that the concentration of tungsten is 70.5 at. % and the concentration of silicon is 29.5 at. %.

In another example, the voltages applied to the targets 28 and 30 are adjusted such that the ratio of the concentration of tungsten and the concentration of silicon in the hard mask HM is within a range between a ratio specifying that the concentration of tungsten is 50 at. % and the concentration of silicon is 50 at. % and a ratio specifying that the concentration of tungsten is 79.4 at. % and the concentration of silicon is 20.6 at. %.

Hereinafter, the case of performing the method MT using the film forming apparatus 10 will be described as an example. In a step ST1, a target object W having a silicon-containing film SF is prepared in the chamber body 12 of the film forming apparatus 10. In the step ST1, the target object W is loaded into the chamber body 12 and mounted on the stage 16.

Next, in a step ST2, a hard mask HM is formed on the silicon-containing film SF. In the step ST2, the vertical position of the stage 16 is adjusted by the driving unit 18, and the stage 16 is rotated about the axis AX. Next, a gas is supplied from the gas supply unit to the chamber 12c, and the pressure in the chamber 12c is decreased by the gas exhaust unit 14.

When the target used in the film forming apparatus 10 contains tungsten and silicon, at least one of the targets 28 and 30 can be used for the film formation in the step ST2. When only one of the targets 28 and 30 is used for the film formation, in the step ST2, a voltage is applied only to a holder that holds the used target. Only the cathode magnet corresponding to the used target is driven by the corresponding magnet driving unit.

When the target 28 is made of tungsten and the target 30 is formed from silicon, in the step ST2, a voltage is applied to both of the targets 28 and 30. The cathode magnet 36 is driven by the magnet driving unit 36a, and the cathode magnet 38 is driven by the magnet driving unit 38a. The voltage applied to the target 28 by the power supply 32 and the voltage applied to the target 30 by the power supply are adjusted such that an amorphous film containing tungsten and silicon is formed on the target object W.

By the execution of the step ST2, the hard mask HM that is an amorphous film containing tungsten and silicon is formed on the target object W. Next, in a step ST3, a pattern is formed on the hard mask HM. The step ST3 can be executed by photolithography and plasma etching.

Hereinafter, tests that have been conducted to evaluate the hard mask HM will be described. In a first test, a plurality of hard masks having different ratios of the concentration of tungsten and the concentration of silicon were formed, and the surfaces of the hard masks were analyzed by an X-ray diffraction method. FIG. 4 is a graph showing the result of a first test and shows analysis results of the hard masks having different ratios of the concentration of tungsten and the concentration of silicon which are obtained by the X-ray diffraction method. In FIG. 4, a horizontal axis represents a diffraction angle 2θ, and a vertical axis represents log intensity. FIG. 4 shows the concentration of tungsten and the concentration of silicon on the surface of the hard mask. As shown in FIG. 4, when the concentration of tungsten on the surface of the hard mask is higher than 50%, diffraction peaks of the crystal plane are observed, which indicates that metal crystals exist in the hard mask. On the other hand, when the concentration of tungsten on the surface of the hard mask is 50% or less, diffraction peaks of the crystal plane are hardly observed, which indicates that there is substantially no metal crystal in the hard mask.

In a second test, a plurality of hard masks having different ratios of the concentration of tungsten and the concentration of silicon were formed, and the insides of the hard masks were analyzed by the X-ray diffraction method. In other words, in a vacuum environment, the hard masks were sputtered, and exposed inner portions thereof were analyzed by the X-ray diffraction method. In the X-ray diffraction method of the second test, an X-ray diffraction spectrum in each of the hard masks was obtained by 2θ-ω scan. FIG. 5 is a graph showing another X-ray diffraction analysis result of the hard masks having different ratios of the concentration of tungsten and the concentration of silicon, and shows the result of the second test. In FIG. 5, a horizontal axis represents a diffraction angle 2θ-ω, and a vertical axis represents log intensity. FIG. 5 shows the concentration of tungsten in the hard mask. The residual concentration in each hard mask is the concentration of silicon. As shown in FIG. 5, when the concentration of tungsten in the hard mask is higher than 79.4%, diffraction peaks of the crystal plane are observed, which indicates that the metal crystals exist in the hard mask. On the other hand, when the concentration of tungsten in the hard mask is 79.4% or less, the diffraction peaks of the crystal plane are hardly observed, which indicates that the metal crystals hardly exist in the hard mask.

While various embodiments have been described above, various modifications can be made without being limited to the above-described embodiments. For example, the above-described film forming apparatus 10 uses two targets. However, when the target used in the method MT contains tungsten and silicon, the film forming apparatus used in the method MT may include a single holder for a single target, a single power supply, a single cathode magnet, and a single magnet driving unit.

DESCRIPTION OF REFERENCE NUMERALS

10: film forming apparatus 12: chamber body
16: stage 20, 22: holder
28, 30: target 32, 34: power supply
W: target object
SF: silicon-containing film
HM: hard mask

The invention claimed is:
1. A hard mask forming method, comprising:
preparing a target object having a silicon-containing film in a chamber body of a film forming apparatus; and
forming a hard mask containing tungsten and silicon, which is an amorphous film, on the silicon-containing film by sputtering using the film forming apparatus,
wherein the hard mask is a hard mask for plasma etching of the silicon-containing film and a ratio of a concen- tration of tungsten and a concentration of silicon on a surface of the hard mask is different from the ratio of the concentration of tungsten and the concentration of silicon inside the hard mask, and wherein the hard mask is formed such that the concentration of silicon is higher than the concentration of tungsten on the surface of the hard mask and the concentration of tungsten is higher than the concentration of silicon inside the hard mask.

2. The hard mask forming method of claim 1, wherein the hard mask is formed using a target containing tungsten and silicon in the film forming apparatus.

3. The hard mask forming method of claim 2, wherein a ratio of a concentration of tungsten and a concentration of silicon in the target is within a range between a ratio in which the concentration of tungsten is 59 at. % and the concentration of silicon is 41 at. % and a ratio in which the concentration of tungsten is 70.5 at. % and the concentration of silicon is 29.5 at. %.

4. The hard mask forming method of claim 1, wherein the hard mask is formed using a first target made of tungsten and a second target made of silicon by the film forming apparatus.

5. The hard mask forming method of claim 4, wherein a voltage to be applied to the first target and a voltage to be applied to the second target are adjusted such that the ratio of the concentration of tungsten and the concentration of silicon on the surface of the hard mask is within a range between a ratio in which the concentration of tungsten is 35 at. % and the concentration of silicon is 65 at. % and a ratio in which the concentration of tungsten is 50 at. % and the concentration of silicon is 50 at. %.

6. The hard mask forming method of claim 4, wherein a voltage to be applied to the first target and a voltage to be applied to the second target are adjusted such that the ratio of the concentration of tungsten and the concentration of silicon inside the hard mask with respect to the surface of the hard mask is within a range between a ratio in which the concentration of tungsten is 59 at. % and the concentration of silicon is 41 at. % and a ratio in which the concentration of tungsten is 70.5 at. % and the concentration of silicon is 29.5 at. %.

* * * * *